United States Patent [19]

Amendola et al.

[11] Patent Number: 4,536,470
[45] Date of Patent: Aug. 20, 1985

[54] METHOD AND APPARATUS FOR MAKING A MASK CONFORMING TO A CERAMIC SUBSTRATE METALLIZATION PATTERN

[75] Inventors: Albert Amendola, Hopewell Junction; Richard G. Christensen, Wingdale; John G. Yereance, Jr., Fishkill, all of N.Y.

[73] Assignee: International Business Machines Corporation, Armonk, N.Y.

[21] Appl. No.: 560,703

[22] Filed: Dec. 12, 1983

Related U.S. Application Data

[62] Division of Ser. No. 415,051, Sep. 7, 1982, Pat. No. 4,474,465.

[51] Int. Cl.³ .......................... G03F 7/02; G03F 9/00
[52] U.S. Cl. ......................................... 430/314; 430/5; 430/22; 430/315; 430/316; 430/318; 430/329; 427/96
[58] Field of Search .................... 430/5, 22, 311, 313, 430/314, 315, 319, 320, 329, 312, 316, 318; 174/68.5; 427/96, 126.2

[56] References Cited

U.S. PATENT DOCUMENTS

| | | | |
|---|---|---|---|
| 3,264,105 | 8/1966 | Houtz, Jr. | 96/36.2 |
| 3,605,260 | 9/1971 | Sprideo et al. | 427/96 |
| 3,791,858 | 2/1974 | McPherson et al. | 430/318 X |
| 3,945,827 | 3/1976 | Brown | 96/36.2 |
| 4,004,044 | 1/1977 | Franco et al. | 427/43 |
| 4,226,932 | 10/1980 | Ferraris | 430/312 |
| 4,245,273 | 1/1981 | Feinberg et al. | 361/382 |
| 4,251,318 | 2/1981 | Oberg et al. | 156/645 |
| 4,430,365 | 2/1984 | Schaible et al. | 427/96 |
| 4,442,137 | 4/1984 | Kumar | 427/57 |

OTHER PUBLICATIONS

Kitcher, J. R., IBM Technical Disclosure Bulletin, vol. 23, No. 4, Sep. 1980, p. 1395.
"A Fabrication Technique for Multilayer Ceramic Module", by H. D. Kaiser et al., *Solid State Technology*, May 1972, pp. 35–40.

*Primary Examiner*—John E. Kittle
*Assistant Examiner*—José G. Dees
*Attorney, Agent, or Firm*—T. Rao Coca

[57] ABSTRACT

This invention concerns method and apparatus for making a mask conforming to a cured MLC substrate. The mask when made may be used to add layers of metallization to the cured substrate by conventional photolithographic techniques. The method and apparatus feature use of the cured substrate itself to pattern the mask. Particularly, the substrate is aligned with the unpatterned mask and the image of the substrate transferred to the mask such that once patterned, the mask may subsequently be realigned with the substrate. In preferred form, a system of notches and grooves are used to align the substrate and mask and a lens system used to transfer the substrate image to the mask. The invention also includes method and apparatus for making an improved MLC substrate. The improvement is characterized by the use of photolithographic techniques to add successive layers of metallization to the cured substrate. This is accomplished by use of a special fixture for combining and aligning the cured substrate with a conforming mask.

6 Claims, 8 Drawing Figures

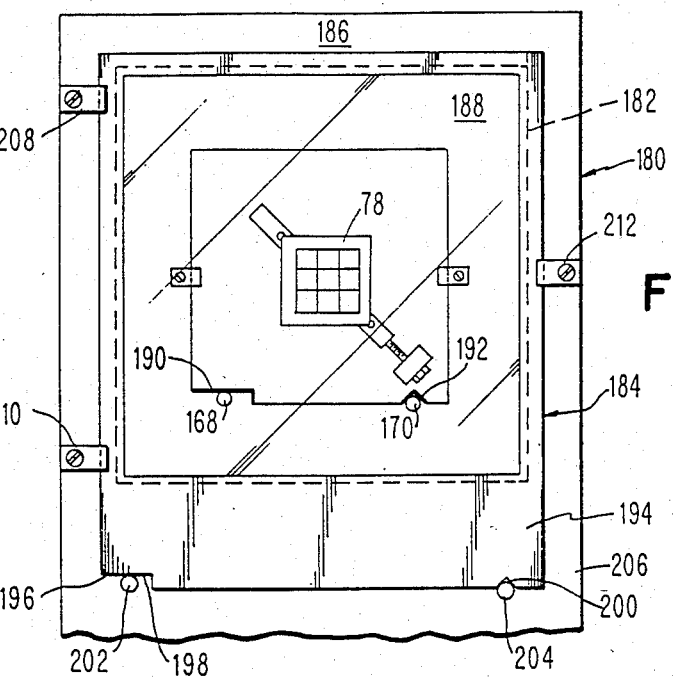
FIG. 4
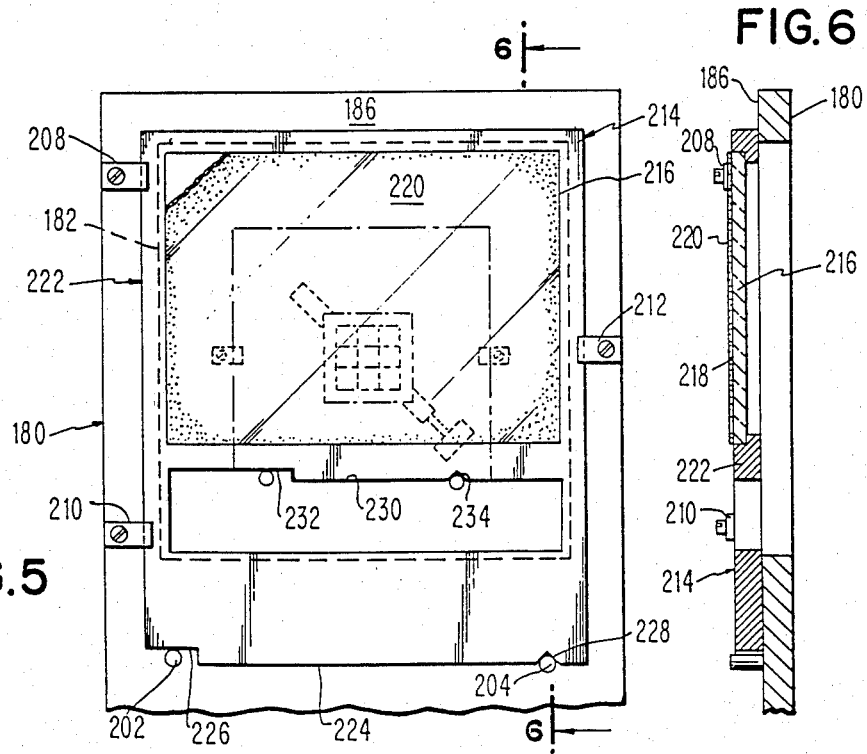
FIG. 5
FIG. 6

METHOD AND APPARATUS FOR MAKING A MASK CONFORMING TO A CERAMIC SUBSTRATE METALLIZATION PATTERN

This is a division of application Ser. No. 415,051 filed Sept. 7, 1982, now U.S. Pat. No. 4,474,465.

TECHNICAL FIELD

This invention relates generally to multilayer ceramic substrates used for packaging large scale integrated circuits and more particularly to method and apparatus for making a mask which conforms to the ceramic substrate metallization pattern so that additional metallization may be added to the substrate using photolithographic techniques and improved method and apparatus for making a multilayer ceramic substrate.

BACKGROUND OF THE INVENTION

The trend in electronics today is to systems of ever increasing component packing density. Increased component density permits designer to achieve greater speed and complexity of system performance within system size constraints by virtue of the large number of circuit elements they can use to perform circuit functions. Additionally, increased component density enables circuit manufacturer to lower production costs owing to the economies they can realize using integrated circuit technology.

The desire for increased component density has given rise to the so-called very large scale integrated (VLSI) circuit. In such circuits, designers pack large numbers of components into individual integrated circuit chips. Subsequently, the designers gang these chips on a single substrate to form larger circuits and functional blocks for the system. To accommodate such high density circuits, designers have developed multilayer ceramic (MLC) substrates which permit the many terminals of the chips to be interconnected in a space efficient manner.

MLC substrates are well known and have been described in such articles as "A Fabrication Technique for Multilayer Ceramic Modules" by H. D. Kaiser et al appearing in *Solid State Technology*, May 1972, pp. 35–40. As Kaiser et al explain in their article, ceramic green sheet, i.e. ceramic powder held together in sheet form by temporary organic binders are metallized using conventional screen printing. The metallized sheets are stacked, laminated and thereafter fired, i.e. cured, to form a monolithic package. This structure provides a three-dimensional wiring system for the chip interconnections in what was formally waste or inaccessible space in the ceramic substrate. The use of this "waste space" results in the creation of a high-density electronic package suitable for handling the high-density integrated circuit chips. An example of a sophisticated embodiment of a semiconductor module including a multilayer ceramic substrate is described in U.S. Pat. No. 4,245,273 assigned to the assignee of this application.

As noted, MLC makers form wiring patterns on the multilayer ceramic by screening a metallic paste consisting of metal powder in an organic binder onto the ceramic. The metal used is selected to be susceptible of being powdered, slurried, screened and fired to form the desired chip interconnect metallization pattern on the ceramic. Most typically, a refractory metal such as molybdenum which is capable of withstanding the substrate curing temperatures is selected.

Following formation of the cured MLC substrate, designers add additional metal layers to the initial molybdenum to obtain desirable bondability characteristics, i.e. a metallization to which the integrated circuit chip may be readily joined. As is well known, molybdenum alone is for practical purposes impossible to bond to. Accordingly, a more bondable metarial such as nickel is used to overlay the molybdenum. To further improve the bond characteristics, a layer of gold may be added over the nickel.

Unfortunately, because of random and non-uniform shrinkage during curing, makers of MLC substrates have been limited in the process techniques that are available to them for applying the subsequent metallization layers. Particularly, because the ceramic shrinks randomly and non-uniformly when cured, MLC makers find that each substrate molybdenum metallization pattern is caused to randomly shrink and distort uniquely. This unique distortion destroys the original size and regularity of patterns when first screened. As a result, conventional photolithographic techniques using a standard master mask have therefore been impossible for MLC makers to use as a method for applying subsequent metal to each of the cured MLC substrates.

To overcome the difficulties associated with random and non-uniform shrinkage, MLC makers have used so-called electroless plating processes. In accordance with electroless plating, the cured MLC having the initial molybdenum metallization on it is immersed in a bath. The bath is prepared to include metal ions which when reacted, selectively plate at the substrate, i.e. at the molybdenum metallization pattern. To effect the reaction, a reducing agent is also included in the bath. The reducing agent supplies the necessary electrons to the metal ions to render them neutral so they may "plate out" of the solution. To induce metal plating only at the substrate metallization, the concentration of metal ions and reducing agent is held low enough so that a catalyst will be required to effect the metal reduction reaction. The catalyst is selectively added to the substrate prior to the substrates immersing in the bath so that the catalyst is present only at the substrate metallization pattern. When the substrate is immersed in the bath, the metal ions are reacted only at the substrate metallization. Since the reaction occurs only at the substrate metallization, the plating is self-aligning and substantially independent of the pattern plated. Accordingly, the difficulties arising from substrate distortion and irregularity due to curing are avoided.

There are, however, difficulties associated with electroless plating. For example, electroless plating is sensitive to process parameter such as temperature, metal ion and reducing agent concentration, application of the catalyst, etc., as well as contaminants on the substrate. As a result, the electroless process can be difficult to control. Where the process is not properly controlled, MLC makers find plating may occur at other than the substrate metallization. Additionally, the layer plated may not adhere to the metallization process or be of non-uniform character. All such results render the plated MLC commercially unacceptable.

SUMMARY OF THE INVENTION

It is therefore an object of the invention to provide method and apparatus for depositing metallization in alignment with an initial MLC substrate metallization following substrate curing.

It is a further object of this invention to provide method and apparatus for depositing metallization to overlay the initial substrate metallization following substrate curing which shows acceptable adherence and uniformity.

It is a still further objective of this invention to provide method and apparatus which would permit the use of photolithographic techniques to deposit metallization overlaying the initial multilayer ceramic metallization following substrate curing.

It is still a further objective of this invention to provide method and apparatus for making a photolithographic mask conforming to the random and non-uniform shrinkage associated with the curing of an MLC substrate which would permit use of photolithographic techniques for depositing metal layers overlaying the initial MLC substrate metallization following substrate curing.

Briefly, this invention includes method and apparatus for making a throw-away mask conforming to i.e. custom tailored to a cured MLC substrate.

More particularly, the method features steps for: providing a cured MLC substrate having an initial metallization pattern on a principal face, which has been uniquely distorted by curing the substrate; providing an unpatterned mask having a radiation sensitive film thereon; aligning the mask with the cured substrate so that the mask may be realigned with the substrate following mask patterning; irradiating the substrate; forming an image of the irradiated substrate at the radiation sensitive film of the mask so as to transfer the image of the substrate and the metallization pattern thereon to the mask; and developing the radiation sensitive film to fix the metallization pattern in the mask thereby patterning the mask.

In a preferred form of the method, the mask's radiation sensitive film is a light sensitive film as, for example, a conventional photoresist layer and the substrate is irradiated with light.

Also in a preferred form of the method, the unpatterned mask is aligned mechanically with the cured substrate. Still further in preferred form, the mechanical alignment is accomplished by using notch and groove alignment means associated with the substrate and mask which cooperation with alignment posts associated with the mask making apparatus.

The invention also contemplates a method for patterning a radiation sensitive film overlying a metallized face of a cured MLC substrate so that the film is patterned in conformity with the metallization.

The method includes the steps of providing a cured MLC substrate having a metallization pattern on a principal face; forming a mask conforming to and in alignment with the cured substrate and the metallization pattern thereon; providing a radiation sensitive film above the cured substrate and metallization pattern thereon; combining the conforming mask with the cured and coated substrate, such that the mask pattern is in alignment with the metallization pattern; irradiating the combined mask and substrate so that the mask pattern is transferred to the film; and developing the film to fix the pattern in it.

In preferred form, the radiation sensitive film is a film of photoresist which is irradiated with light. Additionally, in preferred form the conforming mask is made by the method described above for making a conforming mask and the patterned mask is aligned with the substrate having the radiation sensitive film thereon by using the alignment means employed to align the mask to the substrate when the mask was patterned. Still further, in preferred form, alignment of the patterned mask and substrate is done mechanically. The mechanical alignment, in preferred form, is accomplished by using notch and groove aligning means associated with the substrate and mask which cooperate with alignment posts associated with a fixture for combining the patterned mask and substrate and the apparatus for making the mask.

The invention additionally contemplates an improved method for making a multilayer ceramic substrate. The improved method includes steps for depositing layers of metallization over and in registration with the initial substrate metallizazation. In one preferred form of the method, a mask conforming to the cured ceramic substrate is prepared in accordance with the method described above for making the conforming mask; a layer of metallization is blanket deposited over the principal face of the substrate to cover the initial metallization thereon; a layer of radiation sensitive material is applied to the substrate; the conforming mask is combined with and aligned to the cured ceramic substrate; the coated substrate, mask combination is irradiated so as to transfer the mask pattern to the radiation sensitive film overlaying the substrate in alignment with the initial substrate metallization pattern; the film is then developed forming an etch mask at the blanket deposited metal in alignment with and above the initial substrate metallization, and the blanket deposited metal is etched to removed the metal from the substrate except where the metal overlays the initial metallization. If additional metallization layers are required, the steps described may be repeated as desired. In preferred form, conventional photolithographic techniques are used, i.e. the radiation sensitive film is a layer of photoresist and light is used to pattern the photoresist.

In another preferred form of the method for making the improved substrate, the conforming mask is prepared so that it may be used in a conventional "lift-off" process as generally described in U.S. Pat. No. 4,004,044 to Franco et al to selectively deposit a layer of metallization in alignment with the initial substrate metallization. In preferred form, conventional photolithographic techniques are used. Again, if additional layers are desired, the process may be repeated.

In the preferred forms of the method for making the improved substrate, the conforming mask is made as described above and the mask aligned to the substrate having a radiation sensitive film thereon by using the alignment means employed to align the mask to the substrate when the mask was patterned. The alignment, in preferred form, is accomplished mechanically. Still further in a preferred form, alignment is accomplished by using notch and groove alignment means associated with the mask and substrate which cooperates with alignment posts associated with the mask making apparatus and the apparatus for combining the patterned mask with the substrate having the radiation sensitive film thereon when the substrate film is patterned.

The apparatus for making the conforming mask includes means for: receiving and locating a cured MLC substrate and unpatterned mask, aligning the substrate and mask, irradiating the substrate, and forming an image of the substrate at the unpatterned mask so that the metallization pattern of the substrate is fixed in the mask thereby patterning the mask in conformity with the MLC metallization pattern.

More particularly, the mask making apparatus includes an alignment bed having a first holder for receiving, and locating the cured MLC substrate. The first holder includes elements for adjusting the location of the substrate in the X, Y, and $\theta$ direction, X and Y being the planar rectangular location coordinates of the substrate and $\theta$ being an angle of rotation about the substrate center line perpendicular to the substrate face having the metallizations pattern to be overlaid. Additionally, the apparatus includes a substrate location reference for defining a desired position for the substrate. Still further, the apparatus includes a second holder. The second holder is arranged to alternately receive and locate the substrate location reference and an unpatterned mask. The second holder is positioned on the align bed adjustably displaced in the direction of the bed length from the first holder.

The apparatus also includes means for irradiating the cured substrate and forming an image of the substrate at the second holder so that the image of the substrate may be transferred to the unpatterned mask. In preferred form, the irradiating means includes an array of lamps and the means for forming an image is a one times magnification lens system whose position is adjustable. Additionally, in preferred form, the radiation sensitive film used for the mask and substrate is a conventional photoresist.

The mask making apparatus also includes means for aligning the unpatterned mask with the cured MLC substrate so that the substrate metallization pattern may be used to pattern the mask and so that the conformed mask may be realigned with the substrate when the substrate is coated with a radiation sensitive film and the film patterned with the mask.

In preferred form, the alignment means includes a system of alignment notches and grooves associated with the substrate and mask which are arranged for cooperation with alignment posts provided in the first and second holders and a fixture for combining the patterned mask with the substrate when the substrate is overlaid with a radiation sensitive film. More particularly, the apparatus includes a plate for receiving and holding the cured MLC, the plate having a reference edge in which a notch and groove are provided. The notch and groove are arranged to cooperate with two alignment posts provided in the first holder when the substrate is mounted in the mask making apparatus. Additionally, the location reference and the mask in preferred form are provided with frames having reference edges with notches and grooves within them for cooperation with two alignment posts in the second holder of the mask making apparatus. Still further, the mask frame is provided with two sets of notches and grooves, a first set corresponding to the notch and groove of the substrate location reference for cooperation with the alignment posts of the second holder and a second notch and groove set corresponding to the notch and groove of the substrate holder for cooperation with alignment post in a fixture for combining the patterned mask with the cured MLC substrate when the substrate is overlaid with a radiation sensitive film.

Further, this invention includes apparatus for patterning a radiation sensitive provided above the surface of an MLC substrate and the metallization pattern thereon in conformity with the metallization.

In preferred form, the apparatus includes a mask conforming to the cured MLC substrate metallization; a fixture for combining the mask with a cured MLC substrate coated with the radiation sensitive film such that the mask pattern may be aligned with the metallization of the substrate; and means for irradiating the substrate mask combination such that the mask pattern is transferred to the substrate film in alignment with the substrate metallization pattern.

In preferred form the fixture includes a set of reference posts for cooperation with the notch and groove system associated with the mask frame and the substrate holder described in connection with the mask making apparatus. In addition, the irradiating means is a light source.

Additionally, the apparatus described for patterning the radiation sensitive film overlying the cured substrate may be used for making an improved multilayer ceramic wherein the improvement includes a subsequent metallization layer over the initial MLC metallization using conventional photolithographic techniques.

Finally, this invention includes apparatus for making an improved MLC substrate. The apparatus includes the apparatus above described for making the conforming mask and the apparatus for combining the conforming mask with a cured substrate having a radiation sensitive film thereon.

The above and other objectives and advantages of this invention will be more readily understood with reference to the following detailed description of the invention and the accompanying figures in which:

FIG. 4 is a fragmented section view of the apparatus for making the conforming mask having the substrate reference mounted therein in accordance with this invention taken along lines 4—4 of FIG. 1;

FIG. 5 is a fragmented section view of the apparatus for making the conforming mask having the unpatterned mask mounted therein in accordance with this invention taken along lines 4—4 of FIG. 1;

FIG. 6 is a side view of the apparatus shown in FIG. 5 in accordance with this invention;

MASK MAKING APPARATUS

Figure 1:
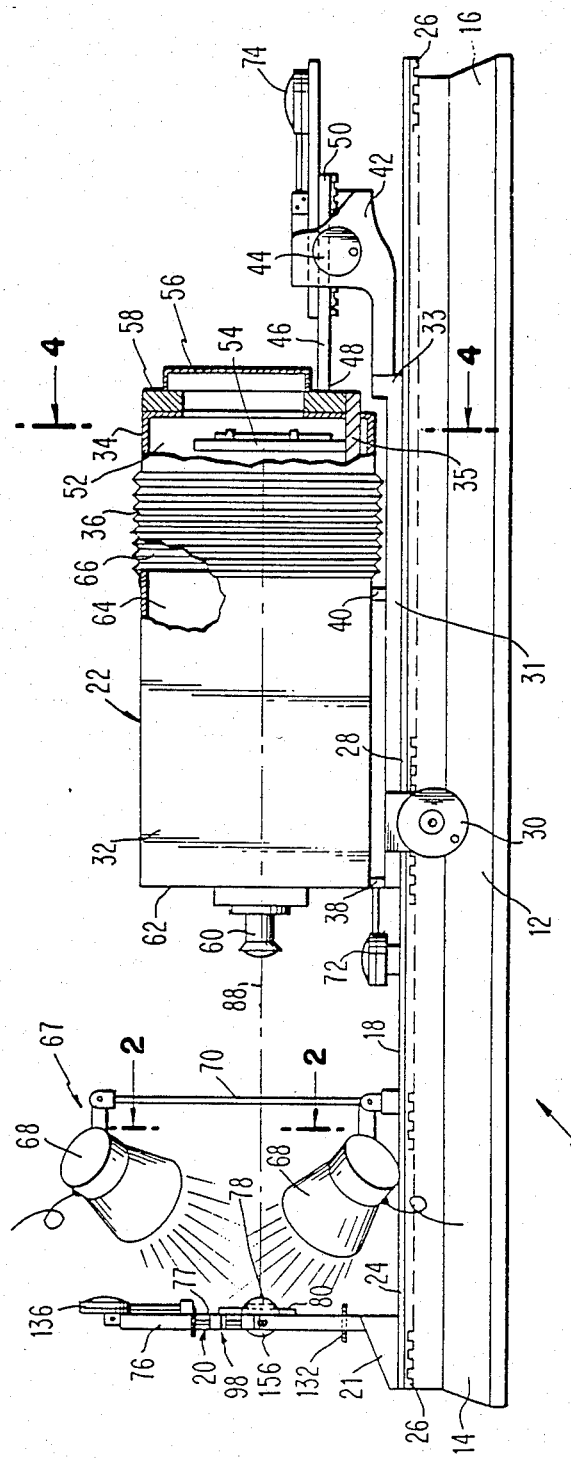
FIG. 1 is a side view of the apparatus for making a mask conforming to a cured MLC substrate in accordance with this invention.

In FIG. 1 an apparatus 10 is shown for making a mask conforming to a cured, i.e. randomly distorted, MLC substrate. As seen in FIG. 1, apparatus 10 includes an alignment bed 12 having a length which extends from a first end 14 to a second end 16. Additionally, bed 12 is seen to have an upper face 18. A first holder 20 is mounted on bed 12 at upper face 18 in the region of bed end 14. Holder 20 is fix mounted to bed 12 in any convenient manner as, for example, by mounting plate 21 as shown. By rigid mounting holder 20, its position in the direction of bed 12's length is fixed.

Continuing with reference to FIG. 1, appratus 10 additionally includes a dark box 22 mounted on bed 12 at upper face 18. Unlike first holder 20, box 22 is movably mounted on bed 12. To facilitate movement of box 22, any convenient arrangement may be used. As shown, in preferred form, box 22 is rendered movable along bed face 18 by providing rails 24 and rack gear 26 in bed face 18 for cooperation with skid face 28 and crank assembly 30 of a support base 31 for box 22.

Continuing with reference to FIG. 1, dark box 22 is shown to have a front section 32 and rear section 34. Front section 32 is separate from rear section 34 so that the two sections may be moved relative to one another in the direction of bed 12's length. The sections are, however, joined to complete box 22 by means of bellows 36.

As seen in FIG. 1, front section 32 is rigidly mounted to base 31 by support members 38 and 40 while box rear section 34 is movably mounted in the direction of bed 12's length with respect to front section 32 and base 31. Any convenient means may be used to movably mount box section 34. In the preferred embodiment shown movable mounting of section 34 is accomplished by means of a carriage 42 which is rigidly mounted to base 31 at base end 33. As shown, carriage 42 includes a crank assembly 44 and a movable support member 46. Member 46 has a first end 48 rigidly mounted to the box rear section 34 at face 58 and a second end 50 drivably engaged in crank assembly 44. In the preferred embodiment shown this drive is of the rack and pinion type. With this arrangement, actuation of crank 44 causes rear section 34 of box 22 to be moved in the direction of bed 12's length relative to the front section 32 and base 31.

Continuing with reference to FIG. 1, as shown in cut away, rear box section 34 has an interior 52 which is seen to include a second holder 54. Second holder 54 is rigidly mounted in rear box section 36 at mount 35. Accordingly holder 54 is movable with section 34 and relative to front section 32 by means of carriage 42. To facilitate access to the interior region 52 and holder 54, rear box section 34 is provided with an access door 56 at its face 58. Door 56 may be mounted in any convenient manner at face 58 as, for example, by hinges.

Also as seen in FIG. 1, a lens system 60 is provided mounted centrally at front face 62 of box section 32. In accordance with this invention, lens system 60 is a 1X magnification system that corrects for lens inversion. In the preferred embodiment, the lens system 60 is a 6 element, 210 mm, F8 1X lens available commercially from the Nikkon Co. under the description APO NIKKON or the equivalent. Lens system 60 is provided in box 22 so that the image of a subject, e.g. an MLC substrate, at first holder 20 may be formed at second holder 54. In accordance with the invention, lens system 60 is selected to be of 1X magnification so that the image formed is identical in size to the subject.

With reference to FIG. 1, front box section 32 includes an interior region 64 which when combined with the interior region 52 of rear section 34 and an interior region 66 of bellows 36 defines the entire interior of box 22. As noted, box 22 is a dark box. Accordingly, with the exception of light admitted by lens system 60, box 22's construction, including bellows 36, rear door 56 and the mounting for lens system 60 is light tight.

Figure 2:
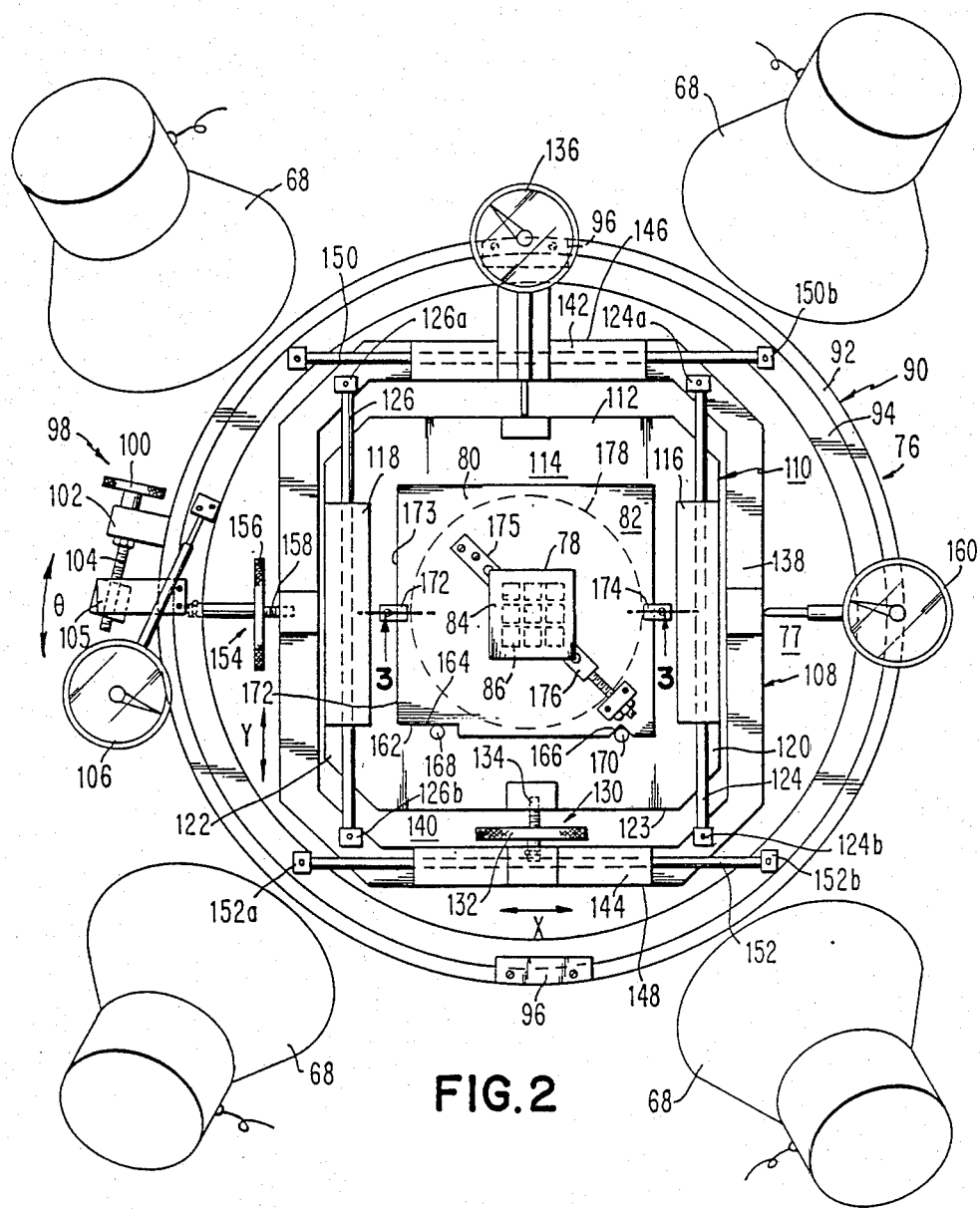
FIG. 2 is a fragmented sectional view of the apparatus for making the conforming mask in accordance with this invention taken along lines 2—2 of FIG. 1.

With continuing reference to FIG. 1, apparatus 10 is seen to also include an irradiation source 67 which in preferred form comprises four lamps 68 circularly disposed about first holder 20 as best seen in FIG. 2 for illuminating holder 20. Lamps 66 may be arranged in any convenient manner as, for example, by mounting assembly 70 affixed to upper face 18 of bed 12. Source 67 is provided so that a subject, e.g. an MLC substrate, at holder 20 can be irradiated and the image thereof produced at second holder 54. As will be explained in more detail hereinafter, the image is used to expose a radiation sensitive film of a mask provided at holder 54. In preferred form, the film is sensitive to light produced by lamps 68. Also, in the preferred form, in order to expose the mask light sensitive film, in a time short enough to avoid the effects of random movement, e.g. 1/1000 of a second, lamps 68 are selected to be photographic strobes of 880 watts each. Particularly, in the preferred embodiment, 4 model 2000 standard flash lamps available from Novation of Dallas, Inc., or the equivalent are used. Additionally, each of the lamps is powered by a model 1081 power supply, also available from Novation of Dallas, Inc., or the equivalent (not shown).

In preferred form, dial indicators 72 and 74 are provided mounted in a conventional fashion at bed 12 and carriage 42 for indicating movement of front section 32 and rear section 34 of box 22 in the direction of bed 12's length.

In accordance with the invention and as suggested above, first holder 20 is arranged to receive and locate a cured MLC substrate. FIG. 2 shows first holder 20 in greater detail. As seen in FIG. 2, cured MLC substrate 78 has a principal face 84 upon which an initial and distorted molybdenum metallization pattern 86 is provided. As shown, holder 20 includes a movable platform 76 and a mounting plate 80 for receiving substrate 78. Substrate 78 is mounted on principal face 82 of a plate 80 and plate 80 is received at face 77 of platform 76.

Movable platform 76 and its face 77 are arranged perpendicularly to upper face 18 of bed 12 so that when substrate mounting plate 80 and substrate 78 are positioned on platform 76 their faces 82 and 84, respectively, are perpendicular to upper face 18 of bed 12 and an axis 88 of apparatus 10 which passes through the center of first holder 20, lens system 60 and second holder 54 in the direction of the apparatus length as best seen in FIG. 1.

Platform 76 is arranged so that substrate 78 may be moved in the plane of platform face 77. Particularly, as seen in FIG. 2, platform 76 is arranged so that substrate 78 may be moved vertically and horizontally of axes 88, axes 88 being perpendicular to the plane of the page at the center of substrate 78. For convenience of notation, the location of substrate 78 may be defined with rectangular coordinates X, Y and Z where Z is the direction of the bed length, along axes 88, X the direction horizontal of axes 88 and Y the direction vertical of axes 88. In addition to permitting movement of substrate 78 in the X and Y direction, platform 76 is arranged to permit angular movement of substrate 78 in a rotational direction $\theta$ about apparatus axes 88.

To facilitate angular movement of substrate 76 platform 76 is provided with an assembly 90 including an outer stationary ring 92 and an inner rotatable ring 94 as seen in FIG. 2. Outer ring 92 defines the outer frame of platform 76 and the plane of face 77. Rotatably mounted within outer frame 92 is an inner ring 94 which is held in the plane of outer ring 92 by keepers 96 positioned around the circumference of ring 92.

An adjustment assembly 98 is provided at rings 92, 94 to facilitate their relative movement. Assembly 98 includes an adjustment knob 100 journaled in a tab 102 which is fixed to the circumference of outer ring 92. Knob 100 is provided with a threaded shaft 104 extending therefrom which is threadably received within a tab 105 affixed to inner ring 94. As knob 100 is turned, shaft 104 pulls inner ring tab 105 towards or pushes ring tab 105 away from outer ring tab 102 with the result that inner ring 94 is rotated in the plane of platform face 77 in the direction $\theta$ relative to outer fixed ring 92.

To monitor the relative movement of rings 92, 94 and accompanying angular rotation of substrate 78, a dial indicator 106 is provided at adjustment assembly 98. Indicator 106 is mounted at rings 92, 94 in a conventional manner.

To facilitate planar movement of substrate 78 vertically and horizontally of axes 88, platform 76 includes a platform member 108 arranged to move only in the X direction (horizontally of axis 88) and a platform member 110 arranged to move only in the Y direction (vertically of axis 88).

With regard to member 110 and as shown in FIG. 2, it includes a plate 112 which in preferred form is generally rectangular having a principal face 114 at which mounting plate 80 and substrate 78 are received. Additionally, member 110 includes bearings 116 and 118 located at the plate sides 120-122, respectively. Member 110 also includes guide rails 124 and 126 fix mounted at platform member 108 which are slidably received in bearings 116 and 118, respectively. Rail 124-126 are fix mounted and vertically oriented at platform member 108 by supports 124a, b and 126a, b, respectively. With this arrangement, plate 112 may be moved along the rails in a vertical direction with respect to member 108. The corners of plate 112 have been cut away to conform with member 108 thereby increasing the extent of travel in the Y direction.

To provide controllable movement of plate 112, a screw jack assembly 130 is provided between platform members 108 and 110. Assembly 130 as best seen in FIG. 2 is located centrally of the horizontal extent of member 108 and 110 at lower side 123 of plate 112. Assembly 130 includes a knob 132 journaled in platform member 108 and a threaded shaft 134 fixed in receiving plate 112. Shaft 134 is threadably received in knob 132 so that as knob 130 is rotated, shaft 134 is drawn into or extended from knob 134 with the result that plate 112 is controllably moved in the Y direction. To monitor movement of plate 112 in the Y direction and with it substrate 78 a dial indicator 136 is mounted at frame member 108. Indicator 136 is mounted in a conventional manner.

With regard to member 108 and as shown in FIG. 2, it includes a plate 138 of a generally rectangular shape arranged in the plane of platform face 77. Plate 138 has an open inner region 140 for receiving and permitting movement of plate 112 of member 110. Like member 110, member 108 includes bearings 142 and 144. In the case of member 110, however, bearings 142 and 144 are located at the top 146 and bottom 148 respectively of plate 138 to permit horizontal movement, i.e. X direction movement. Bearings 142 and 144 are arranged for cooperation with guide rails 150, 152 which are slidably received in bearing 142, 144, respectively. As with member 110, guide rails 150, 152 of member 108 are fix mounted. In the case of member 108, however, rails 150, 152 are fixed at rails mounts 150a, b and 152a, b and oriented horizontally on inner platform ring 94 so that plate 138 may be moved in the X direction in the plane of platform face 77. Like plate 112, the corners of plate 138 have been cut away to increase the extent of movement of plate 138. By localing rail mounts 150a, b and 152a, b on inner ring 94, platform members 108 and 110 are free to rotate with ring 92 in the plane of platform face 77.

Continuing with reference to FIG. 2, like member 110, member 108 is provided with a screw jack assembly 154. Assembly 154 however is arranged to permit controlled movement of plate 138 in the X direction. As shown in FIG. 2, assembly 154 is located centrally of the vertical extent of member 108 between member 108 and ring assembly 90. Assembly 154 includes a knob 156 journaled in ring 94 and a threaded shaft 158 fixed in plate 138. Shaft 158 is threadably received in knob 156 so that as knob 156 is rotated, shaft 158 may be drawn into or extended from knob 134 causing plate 138 to be moved in the X direction.

Like member 110, member 108 is provided with a dial indicator 160 fix mounted at ring 94 to monitor movement of plate 138 and with it substrate 78 in the X direction. Indicator 160 is mounted at ring 94 in the conventional manner.

Based on the configuration of platform 76 as described, it is possible to independently move substrate 78 in the plane of platform face 77, vertically (Y direction), horizontally (X direction) and rotationally ($\theta$) of axis 88 by appropriately manipulating adjustment assemblies 130, 154 and 98 respectively. Dial indicators 136, 160 and 106, respectively, indicate the extent of such movement.

In accordance with this invention, the mask making apparatus also includes alignment means for locating the cured MLC substrate and the unpatterned mask. The alignment means is required so that once the mask is patterned, it may be realigned in a special combining fixture with the substrate having a film overlaying it to pattern the film in conformity with the substrate metallization pattern.

With regard to the positioning and alignment of substrate 78 on the mask making apparatus, and as shown in FIG. 2, substrate 78 is mounted on plate 80 and plate 80 is located on receiving plate 112 of platform 76. To align plate 80 and with it substrate 78, plate 80 is provided with a reference edge 162 having an alignment notch 164 and an alignment groove 166. Notch 164 and groove 166 are provided at edge 162 to cooperate with alignment posts 168 and 170, respectively, arranged in plate 112 perpendicularly to plate face 114.

Figure 3:
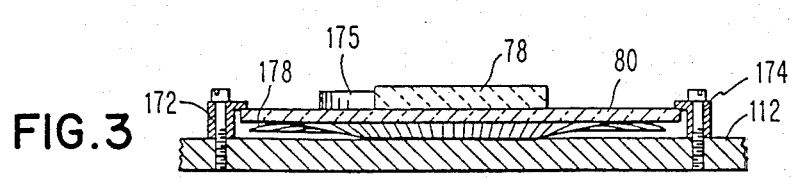
FIG. 3 is a fragmented sectional view of a substrate receiving plate in accordance with this invention taken along lines 3—3 of FIG. 2.

In preferred form, reference edge 162 is located on the lower side of plate 112 to provide gravity assist to the mating of notch 164 and groove 166 with posts 168, 170, respectively. To further stabilize the mating of the notch and groove with the reference post and provide a reference plane for plate 80, retaining lugs 172 and 174 are provided on plate 112 to hold plate 80 to plate 112. To urge plate 80 into intimate contact with the reference edge of retaining lugs 172 and 174, a Bellville spring washer 178 is provided beneath plate 80 at the interface of plate 80 and plate 112 as best seen in FIG. 3.

While any convenient form of retaining lug could be used, in preferred form, the retaining lugs 172 and 174 are held to plate 112 by means of screws as shown.

As will be appreciated by those skilled in the art, reference edge 162 could be located at a side of plate 112 other than the bottom. However, in such case, additional means, as for example a spring loaded detent, would be required to urge the reference notch and groove into mating contact with the alignment posts.

The dimensions of notch 164 and groove 166 are not critical and are selected as desired. However, size should be such as to assure stability of mount. Additionally, the spacing of notch 164 and groove 166 are also not critical provided that they are sufficiently spaced to also assure stability. In preferred form, notch 166 is located at a point approximately 10 to 15 percent of the length of edge 162 as measured from side 173 of plate 80, and groove 166 is located at a point approximately 85 to 90 percent of the length of edge 162 as measured from plate left edge 173.

The size and spacing of posts 168 and 170 are selected to provide stable mating with notch 164 and groove 166. Particularly, and in preferred form, the dimensions of the reference posts are selected such that the radius of post 168 is approximately equal to the depth of notch 164 as measured from reference edge 162 and the radius of post 170 is selected to be equal to that of post 168 and equal approximately to 40 percent of the width of groove 166's base at reference edge 162. The centers of posts 168, 170 are however aligned horizontally so that edge 162 of plate 80 is horizontally aligned.

While the dimensioning and spacing of the substrate notch and groove and companion post may be set as desired, once set they determine the dimension and spacing of the mask and combining fixture alignment means as will be more fully explained hereinafter.

By virtue of the character of a notch and groove alignment system, the sidewalls of groove 166 make tangential contact with post 170 establishing position constraints in the vertical and horizontal direction to the movement of plate 112 on platform 76. Additionally, the base of notch 164 tangentially contacts post 168 establishing a position constraint in the rotational direction about reference post 170, thus locating plate 112 angularly on platform 76.

As shown in FIG. 2, substrate 78 is held in place on face 82 of plate 80 by retaining members. The retaining members may be of any convenient type provided they are able to locate substrate 78 repeatably to within 0.1 mils. Repeatability of this degree is required in order that substrate 78 be replaceable at plate 80 to within that degree of accuracy following the coating of substrate 78 with a film which is subsequently to be patterned with the mask made. This is required to assure the replaced substrate will have the same relation to the notch and groove of the mounting plate as it had when the mask was patterned to sustain the alignability of the substrate and mask. In preferred form, the retention member at plate 80 includes a stop 175 fix mounted at surface 82 of plate 80 for receiving an edge of substrate 78. Additionally, the retention member includes a spring loaded detent 176 for engaging the corner of substrate 78 diagonally opposed to stop 175 as shown. As will be appreciated by those skilled in the art, other conventional retention means could be used.

As shown in FIG. 1, mask making apparatus 10 also includes a second holder 54 mounted in rear section 34 of dark box 22. Second holder 54 is provided in box 22 to support a position guide, i.e. a location reference for substrate 78 and further to subsequently support the mask to be patterned once substrate 78 is positioned. As shown in FIG. 1, holder 54 is fix mounted to support 35 at rear box section 34 and is movable in the Z direction (direction of axis 88) by means of carriage 42.

As best seen in FIG. 4, holder 54 is defined by a plate 180 having a cut away interior region 182. In preferred form, plate 180 is of a generally rectangular shape. Like plate 180, cut away interior region 182 is also rectangular and large enough in area so that when viewed through door 56 of box section 34, substrate 78 and mounting plate 80 may be seen in cut away region 182.

In accordance with this invention, plate 180 is adapted to receive a location reference 184 for substrate 78. As seen in FIG. 4, the location reference 184 is mounted at face 186 of plate 180. As shown, location reference 184 includes a translucent plate 188, preferably ground glass, having location fiducials 190, 192 located in the body of glass. Fiducials 190, 192 correspond to notch 164 and groove 166 of substrate mounting plate 80. Because plate 188 is translucent, the image of substrate 78 and mounting plate 80 relative to fiducials 190, 192 may be seen in the glass when the glass is viewed through the door 56 as illustrated in FIG. 4. The fiducials are fixed in plate 188 in any convenient manner as for example by etching.

Continuing with reference to FIG. 4, location reference 184 is also seen to include a frame 194 for receiving plate 188. Frame 194 is provided with a reference edge 196 having an alignment notch 198 and alignment groove 200 located therein. Notch 198 and groove 200 of reference frame 194 are arranged for cooperation with alignment posts 202 and 204 located at the lower part of holder plate 180 and perpendicular to face 186 of plate 180. Retention lugs 208, 210 and 212 are provided on plate 180 to hold frame 194 in contact with face 186 of plate 180 and provide a reference plane for plate 180. In preferred form, the lugs are of the screw type as shown.

As in the case of substrate mounting plate 80, reference edge 196 of frame 194 is located at the bottom side of frame 194 so that the mating of notch 198 and groove 204 with companion alignment posts 202 and 204, respectively, may be gravity assisted. As will be appreciated by those skilled in the art, reference edge 196 could be located at another side of frame 194. In such case, a resilient detent would be required to assure intimate contact between notch 198, groove 200 and posts 202, 204, respectively.

The dimensioning and sizing of notch 198, groove 200 and companion posts 202, 204 are selected, to provide a stable mount. However, they must also be selected so as to permit a translucent plate 188 of sufficient size to encompass the full image of substrate 78 formed at holder 54 by lens system 60. More particularly and as shown in FIG. 4, plate 188 is made large enough so that the image of substrate 78 and mounting plate 80 fall within its boundaries as shown. This is done so that fiducials 190, 192 may be placed to be conveniently observable within plate 188. As shown, in preferred form, fiducials 190, 192 are located well within plate 188 at its lower quarter.

Fiducials 190 and 192 located in plate 188 are formed to be substantially identical in size and spacing to notch 164 and groove 166 of substrate mounting plate 80. By setting fiducials 190 and 192 substantially identical to the substrate mounting plate notch and groove and by rigidly mounting the fiducials, at least in the X and Y direction relative to axes 88, the fiducials define a location reference in the X and Y direction to which substrate 78 may be adjusted by means of platform 76.

Regarding the conforming mask and as seen in FIG. 5 and 6, second holder 54 is adapted to also receive a mask 214 to be patterned. Mask 214 as shown includes a plate 216 having a principal face 218 upon which a radiation sensitive film 220 is provided. Film 220 is selected to be sensitive to the radiation which will be used to illuminate the substrate. In preferred form, film 220 is selected to be responsive to light, for example, a conventional photoresist. In the case where the mask is to be positive, a conventional AZ-1350 type photoresist commercially available from the Shipley Corporation can be used. Where the mask is to be negative, a 450 type photoresist commercially available from the Hunts Corporation may be used.

In accordance with this invention, mask plate 216 is mounted in a mask frame 222 specially adapted to permit the unpatterned mask to be aligned with substrate 78 when the mask is made and to thereafter permit the patterned mask to be realigned in a special fixture with substrate 78 overlaid with a film when the mask is used to pattern the film in conformity with the initial substrate metallization. To accomplish this, frame 222 is provided with a dual alignment means in the form of two reference edges having two sets of alignment notches and grooves for cooperation with two different sets of alignment posts.

As seen in FIG. 5, mask frame 222 is mounted on face 186 of holder plate 180 in a manner substantially identical to the mounting of substrate location reference 184. Like frame 194 of reference 184, mask frame 222 is held at face 186 of plate 180 by retention lugs 208, 210 and 212. Continuing with reference to FIG. 5, mask frame 222 is seen to have a first reference edge 224 having an alignment notch 226 and an alignment groove 228 therein for cooperation with alignment posts 202 and 204 of plate 180. By virtue of their cooperation with alignment posts 202 and 204 of plate 180, the dimensioning and spacing of alignment notch 226 and alignment groove 228 of frame 222 are determined and are substantially identical to those of substrate location reference 180, i.e. notch 198 and groove 200.

Reference edge 224 in preferred form is located at the lower side of mask frame 222 in conformity with edge 196 of reference 184. As will be appreciated by those skilled in the art, the location of reference edge 224 is other than the bottom side of frame 222 where edge 196 of reference 184 is located otherwise.

In addition to the first reference edge 224 and notch and groove 226 and 228, respectively, mask frame 222 also includes a second reference edge 230 having a second alignment notch 232 and groove 234. Notch 232 and groove 234 are dimensioned and positioned substantially identical to alignment notch 164 and 170 of substrate mounting plate 80 and fiducials 190 and 192 of location reference 84.

Accordingly, because substrate 78 has been aligned with fiducials 190 and 192 of reference 184, when mask 214 is mounted at holder 54, using the first alignment notch and groove 198, 200, second alignment notch and groove 232, 234, align with the notch and groove 164 and 166 of substrate mounting plate 80. As a result, when the image of substrate 78 is transferred to mask 214, by lens system 60, the image has the same relation to mask alignment notch 232 and alignment groove 234 as substrate 78 has to the notch and groove 164, 166 of substrate mounting plate 80. In this way, mask 214 is patterned to conform and align with substrate 78 and the metallization pattern thereon. Thus the patterned mask may later be combined and aligned with substrate 78 so that the mask pattern will overlay the original substrate metallization.

MASK AND COATED SUBSTRATE COMBINING APPARATUS

Figure 7:
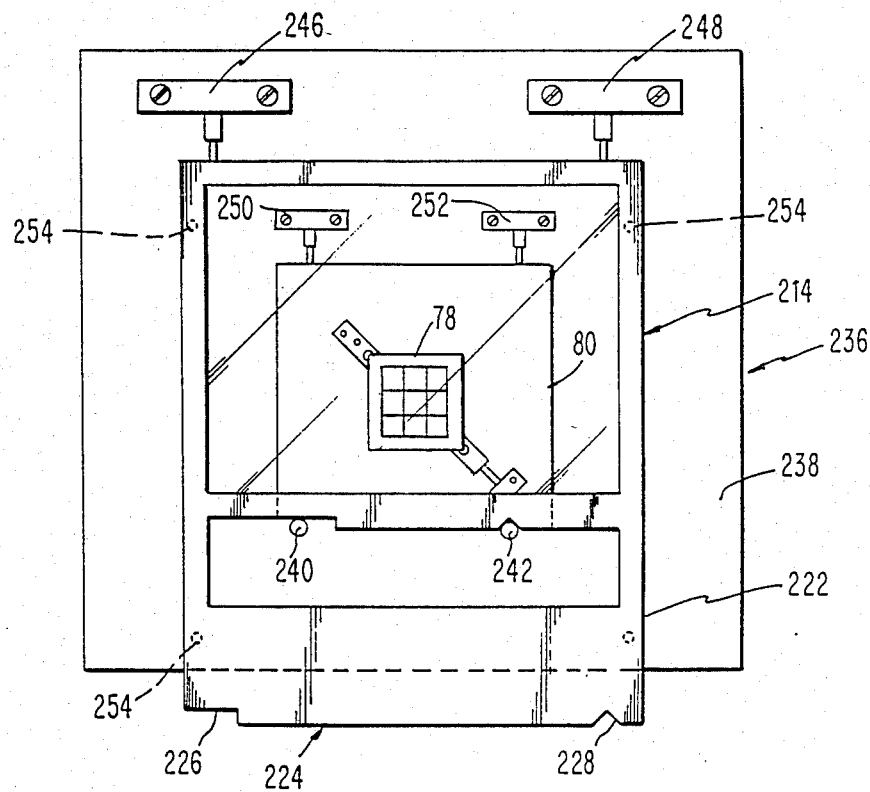
FIG. 7 is an assembly top view of the fixture for combining the conforming mask and the cured substrate for patterning a radiation sensitive film overlaying the substrate, together with the mask and substrate in accordance with this invention.
Figure 8:
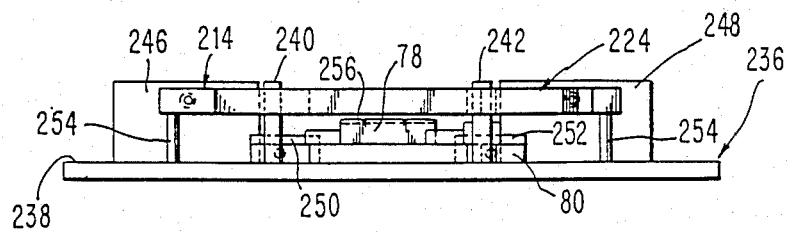
FIG. 8 is an assembly side view of the fixture for combining the conforming mask and cured substrate having a radiation sensitive film thereon together with the mask and substrate in accordance with this invention.

As described above, the patterning of mask 214 is carried out so that the mask may be realigned with substrate 78 when substrate 78 is covered with a radiation sensitive film. Apparatus for combining patterned mask 214 and substrate 78 having a coating thereon is shown in FIGS. 6 and 7. As seen in FIG. 6, the apparatus includes a special combining fixture 236 having a principal face 238 for receiving plate 80 and substrate 78 and above them mask 214. As shown, fixture 236 includes reference posts 240 and 242 extending perpendicularly from face 238. Alignment posts 240 and 242 in accordance with this invention are sized and spaced in face 238 so as to be identical to the size and spacing of alignment posts 168 and 170 of substrate receiving plate 112. Accordingly, substrate mounting plate 80 may be located at face 238 of fixture 236 and thereafter aligned and overlaid with patterned mask 214 as shown. To assure intimate contact of plate 80 and substrate 78 at alignment posts 240, 242, frame 236 is provided with retaining means 250, 252 to urge notch 162 and groove 164 of plate 80's reference edge 162 into contact with alignment posts 240, 242. Likewise, to assure intimate contact of mask frame 222 at alignment posts 240, 242 retaining means 246, 248 are provided to urge notch 232 and groove 234 of mask 214's reference edge 230 into contact with alignment posts 240, 242. In preferred form, as shown in FIG. 6, retaining means 246, 248, 250 and 252 are screw adjustable spring loaded detents. As will be clear to those skilled in the art, other means could be used. As best seen in FIG. 8, mask 214 is located above and slightly displaced from substrate 78 to avoid damage to the radiation sensitive film 256 by means of spacer posts 254.

Because notch 164 and groove 166 of substrate mounting plate 80 are substantially identical to notch 232 and groove 234 of mask frame 222, mask 214 will overlay substrate 78 with the same alignment that existed when substrate 78 was used to pattern mask 214. As a result, when film 256 of radiation sensitive material is placed over substrate principal face 84 it may be patterned in registration with the underlying substrate metallization pattern 86 using mask 214.

As in a conventional photolithographic process, once the substrate 78 is coated with radiation sensitive film 256, and aligned with mask 214 film 256 may be patterned by irradiating the mask substrate combination with radiation to which the film is sensitive. In preferred form, the substrate film coating is a light sensitive photoresist either positive or negative depending on the process for metallizing the substrate 78 as will be described hereinafter. Accordingly, in preferred form, the combination is irradiated with a light.

OPERATION OF THE MASK MAKING APPARATUS

In accordance with this invention, the operation of the mask making apparatus is as follows. After substrate 78 has been cured and the resulting random distortions established, substrate 78 is mounted on plate 80 of first holder platform 76. Thereafter, substrate location reference 184 is mounted at plate 180 of second holder 54. Access to second holder 54 within rear section 34 of box 22 is had through door 56.

Following mounting of location reference 184, crank 30 associated with base 32 and crank 44 of carriage 42 are manipulated to adjust the Z direction position of reference 184 until the image of substrate 78 produced by lens system 60 is focused at translucent plate 188. Thereafter, the location of substrate 78 in the X and Y direction is adjusted to conform with the position defined by reference 184. This is done by manipulating platform 76. More particularly, screw jacks 130, 154 and assembly 98 of substrate platform 76 are adjusted to bring notch 164, groove 166 of mounting plate 80 into exact alignment with fiducials 190 and 192 of substrate location reference 184.

Subsequently, substrate location reference 184 is removed from second holder 54 and replaced by mask 214 having an unpatterned radiation sensitive film 220 thereon. Without further adjustment, and within a darkened environment, radiating source 67 of apparatus 10 is activated to irradiate substrate 78. As a result of the irradiation of substrate 78, an image of substrate 78 is formed at the radiation sensitive film of mask 214. Because of the identity of fiducials 190 and 192 of location reference 184 and notch 232 and groove 234 of mask frame 222, the image of substrate 78 formed at radiation sensitive film 220 bears the same relationship to alignment notch 232 and alignment groove 234 as the metallization pattern of substrate 78 bears to alignment notch 164 and alignment groove 166 of substrate mounting plate 80.

Following irradiation of mask film 220, the film is developed to fix the substrate image in it thereby conforming mask 214 to the metallization pattern of cured substrate 78.

OPERATION OF THE APPARATUS FOR COMBINING THE MASK AND COATED SUBSTRATE

The operation of the apparatus for patterning a film overlaying the substrate 78 is as follows. After the conforming mask has been patterned, substrate 78 may be removed from mask making apparatus 10 and a layer of radiation sensitive film 256, e.g. photoresist, applied to its principal face 84. The film 256 may be applied directly to substrate principal face 84 in the case where a conventional "lift-off" process will be used to form the subsequent layers of metallization. In this case the film is positive and of a conventional "lift-off" type as described in U.S. Pat. No. 4,004,044 to Franco et al. In the alternative, a layer of metallization to overlay the initial molybdenum is first blanket deposited at substrate face 84. Thereafter, film 256, e.g. photoresist, may be applied to the blanket deposition. In this case the photoresist is negative as, for example, a 450 type photoresist commercially available from the Hunts Corporation.

In either case, following the formation of the film on substrate 78, substrate 78 as mounted on plate 80 is loaded into fixture 236. Plate 80 is thereafter loaded into fixture 236 by aligning notch 164 and groove 166 of plate 80 with alignment posts 240 and 242 of fixture 236. Next, patterned mask 214 is positioned on fixture 236 by aligning notch 232 and groove 234 of mask frame 224 with alignment posts 240 and 242 of plate 236. As noted above, substrate receiving plate 80 and mask frame 222 are held in place at fixture 236 by retention members 250, 252 and 246, 248, respectively.

Following combination of coated substrate 78 and patterned mask 214 at fixture 236, they are irradiated with radiation to which film 256 overlaying substrate 78 is sensitive, e.g. light for activating the particular photoresist used. Accordingly, the pattern of mask 214 is transferred to the substrate film. Thereafter, the film may be developed to fix the pattern in the film.

In the case where lift-off process is used, the mask pattern is positive so that the film remains on the substrate in those regions where the initial molybdenum metallization does not exist, consistent with the conventional lift-off process. In the case where the substrate 78 has been blanketed with metallization, the radiation sensitive film is negatively patterned so that the film remains only at the initial molybdenum metallization. Accordingly, the negative film may be used as a conventional etch mask and the blanket metallization removed by etching other than where it overlies the initial molybdenum metallization.

METHOD FOR MAKING THE CONFORMING MASK

The method for making the conforming mask in accordance with this invention will be described with reference to the apparatus and operation thereof for making the mask previously explained. As noted in connection with the description of the mask making apparatus, a principal aspect of the invention is the use of the cured and distorted substrate itself as the means for patterning the mask. Therefore, the first step in the method for making the mask is to make the cured MLC substrate available for patterning the mask. With regard to the apparatus, this step corresponds to the initial mounting of the substrate on the apparatus first holder.

Following substrate mounting, it is necessary to locate the substrate so that it can be aligned with the mask to be patterned. Again with regard to the mask making apparatus this corresponds to use of the substrate location reference to define a desired position for the substrate. The desired position for the substrate is arrived at by optically aligning the substrate to visually observable fiducials in the substrate reference. In this positioning step, the substrate location is adjusted by manipulating the substrate mounting plate until the substrate registers with the fiducials of the substrate location reference.

Following location of the substrate, it is necessary to provide the unpatterned mask and align it with the substrate such that following patterning, it and the substrate may be realigned. In accordance with this invention, the mask alignment is compound. The compound alignment includes a first alignment component which comprises aligning the mask with the substrate reference and a second alignment component which comprises establishing a basis for aligning the mask to the substrate which is dependent on the alignment of the mask to the substrate reference. More particularly and with regard to the apparatus, for the first component of the alignment, the mask is aligned with the substrate reference by providing the mask with a first reference edge and mounting it substitutionally to the substrate location reference following the use of the substrate location reference. For the second component of the alignment the mask is made alignable with the substrate by providing the mask with a second reference edge and mounting identical to that of the substrate. The first and second alignment components are linked by coupling the mask's first and second reference edge through the mask frame.

Once the mask is mounted and aligned, the image of the substrate is transferred to the mask so as to pattern it. To facilitate this, the mask is provided with a film sensitive to the radiation used to image the substrate. In preferred form, the film is light sensitive photoresist and the radiation is light to which the film reacts. The photoresist may be positive or negative depending on how the mask will subsequently be used. The photoresists are of the type which have been previously described. Other than the light and a light sensitive film could be used. For example, x-ray radiation and an x-ray sensitive film could be used as well as other forms of radiation as would be apparent to those skilled in the art.

Again with reference to the apparatus, once the substrate is irradiated, the substrate image is transferred to the mask. In preferred form, the radiation is light and the image transfer is accomplished optically with a lens system. Other techniques as would be apparent to one skilled in the art could be used where other types of radiation are used.

Following transfer of the image to the mask, the image is fixed in the mask film by developing. In preferred form, the development step is typical of the development done for conventional photoresists.

METHOD FOR PATTERNING A FILM OVERLAYING AN MLC SUBSTRATE

This invention also contemplates a method for patterning a radiation sensitive film overlaying a cured MLC substrate such that the pattern conforms to an underlying substrate metallization pattern. Like the method for making the conforming mask, the method for patterning the substrate film will be described with reference to the apparatus and operations thereof previously explained. A principal feature of the method is the combining of the coated substrate with a mask custom tailored, i.e. conforming to the cured substrate metallization pattern such that when combined the mask may be used to pattern the film in conformity with the underlying substrate metallization. In accordance with the method, the first step is to provide the cured MLC substrate. Subsequently, a conforming mask is prepared for the substrate. In accordance with the invention, the mask is prepared as described in connection with the method and apparatus previously described for that purpose. Following preparation of the mask, the substrate is coated with a radiation sensitive film. In preferred form, the film is a photoresist which may be applied directly to the substrate overlaying the substrate metallization pattern to which the film is to be referenced. In the alternative, the substrate and its initial metallization may be overlaid with a blanket deposit of metal and the photoresist applied thereafter. In preferred form, the photoresist is applied in a conventional fashion as, for example, by spinning. As noted in connection with the description of the apparatus, the photoresist may be positive or negative as desired and of the type previously noted.

Following coating of the substrate, the mask and substrate are combined so as to align the mask with the substrate original metallization. In preferred form and with regard to the apparatus, this step corresponds to the use of the special combining apparatus which mechanically aligns the substrate and mask using the described alignment notch and groove system.

Following the combination of the mask and coated substrate, the pattern of the mask is transferred to the substrate film. This is done by irradiating the combination with a radiation to which the substrate film is sensitive. In preferred form, the radiation is light to which the photoresist reacts. Finally, following the transfer of the mask pattern to the substrate film, the film is developed fixing the pattern therein.

IMPROVED METHOD FOR MAKING AN MLC SUBSTRATE

The method for making an improved MLC substrate in accordance with this invention includes the method for patterning a radiation sensitive film and the method for making the conforming mask as described above. In preferred form, the conforming mask is a photolithographic mask. Additionally, the conforming mask is used to apply subsequent layers of metallization by either a conventional "lift-off" process or a blanket deposition and back etch. To facilitate the formation of the subsequent metallization layers, the mask is used to pattern a light sensitive film, i.e. photoresist, overlaying the substrate as described herein. In accordance with the method, the steps for making the conforming mask and patterning the photoresist may be repeated as desired to apply successive layers of metallization.

While this invention has been described in connection with a preferred embodiment, it will be appreciated by those skilled in the art that alterations, modifications and adjustments to the invention may be made without departing from its scope.

What we claim is:

1. A method of forming a metallization pattern in conformity with an original metallization pattern on a cured multilayer ceramic substrate, said method comprising:
   providing a cured multilayer ceramic substrate having an original metallization pattern on at least one principal surface thereof;
   forming a rigid custom tailored negative photographic mask bearing the image of the cured multilayer ceramic substrate and the original metallization pattern thereon;
   forming a blanket metal layer on said cured substrate including said original metallization pattern;
   providing a radiation sensitive film on said blanket metal layer;
   aligning the custom mask with the cured substrate having the blanket metal layer and radiation sensitive film thereon such that the mask image pattern is in exact alignment with the original metallization pattern;
   exposing the radiation sensitive film through said custom mask to transfer the mask image pattern to the film;
   developing said radiation sensitive film to form a patterned mask of said film on said metal layer in complete and exact correspondence with said original metallization pattern; and
   etching said metal layer in accordance with said patterned mask.

2. The method of claim 1 wherein the steps for making the custom tailored mask comprise:
   providing the cured multilayer ceramic substrate at a desired location;
   providing a rigid mask substrate having an unpatterned radiation sensitive layer displaced from and in exact alignment with the multilayer ceramic substrate such that following separation, the multilayer ceramic substrate and mask substrate may be realigned;

illuminating the multilayer ceramic substrate with radiation to transfer an image of the the original metallization pattern on the multilayer ceramic substrate to the unpatterned radiation sensitive layer on the mask substrate in alignment with the multilayer ceramic substrate metallization pattern thereby patterning said radiation sensitive layer on the mask substrate;

developing the radiation sensitive layer to fix the image of the illuminated multilayer ceramic substrate and metallization pattern thereon in the mask substrate.

3. The method of claim 2 wherein the alignment of the mask substrate and the multilayer ceramic substrate during the patterning of the radiation sensitive layer on the mask substrate is used to realign the custom tailored mask and the multilayer ceramic substrate when the custom tailored mask is combined with the multilayer ceramic substrate having said blanket metal layer and radiation sensitive film thereon.

4. A method of photolithographically forming a subsequent metallization pattern overlaying and in perfect registration with an initial metallization pattern on a principal surface of a cured multilayer ceramic substrate, the method comprising:

providing a cured multilayer ceramic substrate having an initial metallization pattern on a principal surface thereof;

forming a custom photolithographic mask bearing an exact image of said initial metallization pattern;

blanket depositing a layer of metallization on said substrate surface including the initial substrate metallization pattern;

forming a layer of photosensitive film on said deposited metal layer;

aligning said custom mask and said substrate such that the mask image pattern is in one-to-one correspondence with the initial metallization pattern on said substrate;

exposing the photosensitive film through said custom mask to transfer the image thereon to the photosensitive film;

developing the photosensitive film to remove the film from the deposited metal layer except where the film is in correspondence with the initial substrate metallization, the remaining photosensitive film serving as an etch mask for said metal layer;

etching the metal layer to remove portions thereof which are not masked by said remaining photosensitive film; and removing the remaining photosensitive film;

whereby is formed a subsequent metallization pattern fully mated with said initial metallization pattern.

5. The method of claim 4 wherein the steps are repeated as desired to apply additional layers of metallization overlaying and in exact correspondence with the initial and subsequent metallization.

6. The method of claim 4 wherein the photosensitive film is applied directly to the substrate and the initial metallization pattern thereon; the custom mask being used to transfer an image of the substrate initial metallization pattern to the photosensitive film provided on the substrate such that when the photosensitive film is developed, it is removed where the film is in alignment with the initial metallization pattern; depositing a layer of metallization over the substrate so as to cover the photosensitive film and exposed intitial metallization; and lifting off the photosensitive film and metallization thereon to leave deposited metal only at and in exact correspondence with the initial metallization.

* * * * *